(12) United States Patent
Guenther et al.

(10) Patent No.: US 9,294,237 B2
(45) Date of Patent: Mar. 22, 2016

(54) METHOD FOR PERFORMING JOINT JITTER AND AMPLITUDE NOISE ANALYSIS ON A REAL TIME OSCILLOSCOPE

(71) Applicant: Tektronix, Inc., Beaverton, OR (US)

(72) Inventors: Mark L. Guenther, Portland, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/552,265

(22) Filed: Nov. 24, 2014

(65) Prior Publication Data

US 2016/0036568 A1     Feb. 4, 2016

Related U.S. Application Data

(60) Provisional application No. 62/031,069, filed on Jul. 30, 2014.

(51) Int. Cl.
*H04L 1/20* (2006.01)

(52) U.S. Cl.
CPC ..................... *H04L 1/205* (2013.01)

(58) Field of Classification Search
CPC ........ G01R 13/00; G01R 27/00; G01R 29/26; G06F 17/10; G06F 17/15; G06F 17/18; G06F 17/50; G06F 19/00; H03D 1/06; H03K 9/08; H04L 1/205; H04Q 1/20
USPC .......... 370/210, 516; 375/224–229, 238, 346, 375/348, 371; 455/296; 702/66–69, 77, 702/117, 179, 181
See application file for complete search history.

(56) References Cited

U.S. PATENT DOCUMENTS

| 7,522,661 | B2 | 4/2009 | Nelson et al. | |
|---|---|---|---|---|
| 2004/0002826 | A1* | 1/2004 | Sepp | G01R 13/029 702/67 |
| 2006/0018374 | A1* | 1/2006 | Nelson et al. | 375/227 |
| 2006/0167652 | A1* | 7/2006 | Stimple | 702/179 |
| 2007/0100596 | A1* | 5/2007 | Hollis | G06F 17/5036 703/14 |
| 2009/0094302 | A1* | 4/2009 | Hollis | 708/271 |
| 2010/0100346 | A1* | 4/2010 | Martin | G01R 13/0227 702/68 |
| 2012/0226727 | A1* | 9/2012 | Zivny | H04L 1/205 708/290 |

* cited by examiner

*Primary Examiner* — Sam K Ahn
*Assistant Examiner* — Shawkat M Ali
(74) *Attorney, Agent, or Firm* — Marger Johnson (57) ABSTRACT

A method for determining jitter and noise of an input signal. The method includes acquiring one or more uncorrelated waveform records by an acquisition unit of a test and measurement instrument, determining a correlated waveform from the acquired waveform(s), dividing the correlated waveform into unit intervals, dividing an uncorrelated waveform into unit intervals, measuring a timing displacement ($t_1$) between the correlated waveform and the uncorrelated waveform for each unit interval to form an apparent-jitter array ($[t_1]$), measuring a voltage displacement ($V_1$) between the correlated waveform and the uncorrelated waveform for reach unit interval to form an apparent-noise array ($[V_1]$), calculating a horizontal shift ($t_s$) between the correlated waveform and the uncorrelated waveform for each unit interval to form a compensated edge time array ($[t_s]$), and calculating a vertical shift ($V_s$) between the correlated waveform and the uncorrelated waveform for each unit interval to form a compensated amplitude voltage array ($[V_s]$).

13 Claims, 4 Drawing Sheets

METHOD FOR PERFORMING JOINT JITTER AND AMPLITUDE NOISE ANALYSIS ON A REAL TIME OSCILLOSCOPE

PRIORITY

This application claims benefit of U.S. Provisional Application No. 62/031,069 filed Jul. 30, 2014, which is hereby incorporated by reference in its entirety.

TECHNICAL FIELD

This disclosure relates to performing joint jitter and amplitude noise analysis to generate two-dimensional probability density functions and bit error rate eye diagrams.

BACKGROUND

In the field of high-speed serial data communication, analysis of timing jitter has been of interest. Many concepts were formalized with a publication of the Fibre Channel Methodologies for Jitter and Signal Quality Specification (Technical Report TR-35-2004, Washington, D.C.: ANSI/INCITS, 2004). The methods described in the Fibre Channel Methodologies for Jitter and Signal Quality Specification allow analysis of timing jitter at a specific reference voltage. The reference voltage corresponds to a horizontal slice through an eye diagram at the given level. However, the methods make no attempt to analyze voltage noise.

U.S. Pat. No. 7,522,661, titled "METHOD OF PRODUCING A TWO-DIMENSIONAL PROBABILITY DENSITY FUNCTION (PDF) EYE DIAGRAM AND BIT ERROR RATE EYE ARRAYS," incorporated herein by reference in its entirety, describes a method of first performing a voltage analysis on a waveform location that is flat (i.e., has zero slew rate) and is therefore theoretically unaffected by timing jitter. Then, a jitter analysis is performed on a high-slew-rate area in which the effects of noise are mathematically removed. Together, with additional steps described in U.S. Pat. No. 7,522,661, a statistical description of the eye at all points vertically and horizontally can be determined.

Sampling oscilloscopes are well known. When utilized to measure repeating high frequency electrical waveforms, such devices conventionally sample small sequential portions of successive waveforms. Thus, the cumulative result of this sampling technique provides a composite waveform readout representative of the subject waveforms. The method described in U.S. Pat. No. 7,522,661 is well-adapted to the strengths of a sampling oscilloscope, which can be configured to repetitively sample and store a particular location in a repeating waveform without wasting memory or other resources on the remainder of the waveform. The method of U.S. Pat. No. 7,522,661 gathers information to separate jitter from noise using only two sampling locations per pattern repetition.

In contrast, a real-time digitizing oscilloscope acquires and stores samples spaced closely-enough that the features of the waveform can be represented directly by the sequential samples. The method of U.S. Pat. No. 7,522,661 results in low efficiency on a real-time oscilloscope since most of the acquired samples are thrown out without being used. This lack of efficiency becomes more pronounced as pattern length increases. To accumulate sufficient statistics on sampling locations chosen as described in U.S. Pat. No. 7,522,661, a real-time oscilloscope has to acquire and process many real-time waveforms. In addition, the real-time oscilloscope possesses valuable information about the dynamic characteristics of the waveform in the vicinity of a target analysis point, such as the slope of the preceding edge, but the method of U.S. Pat. No. 7,522,661 fails to take advantage of this information.

Embodiments of the invention address these and other limitations in the prior art.

SUMMARY

According to aspects illustrated herein, there is provided a method for determining jitter and noise of an input signal. The method includes acquiring one or more uncorrelated waveform records by an acquisition unit of a test and measurement instrument, determining a correlated waveform from the acquired waveform(s), dividing the correlated waveform into unit intervals, dividing the at least one uncorrelated waveform into unit intervals, measuring a timing displacement ($t_1$) between the correlated waveform and the uncorrelated waveform for each unit interval to form an apparent-jitter array ($[t_1]$), measuring a voltage displacement ($V_1$) between the correlated waveform and the uncorrelated waveform for each unit interval to form an apparent-noise array ($[V_1]$), calculating a horizontal shift ($t_s$) between the correlated waveform and the uncorrelated waveform for each unit interval to form a compensated edge time array ($[t_s]$), and calculating a vertical shift ($V_s$) between the correlated waveform and the uncorrelated waveform for each unit interval to form a compensated amplitude voltage array ($[V_s]$).

According to other aspects illustrated herein, there is provided a test and measurement instrument. The test and measurement instrument includes acquisition means configured to receive one or more uncorrelated waveform records and processing means. The processing means determines a correlated waveform, divides the correlated waveform into unit intervals, divides the at least one uncorrelated waveform into unit intervals, measures a timing displacement ($t_1$) between the correlated waveform and the uncorrelated waveform for each unit interval to form an apparent-jitter array ($[t_1]$), measures a voltage displacement ($V_1$) between the correlated waveform and the uncorrelated waveform for reach unit interval to form an apparent-noise array ($[V_1]$), calculates a horizontal shift ($t_s$) between the correlated waveform and the uncorrelated waveform for each unit interval to form a compensated edge time array ($[t_s]$), and calculates a vertical shift ($V_s$) between the correlated waveform and the uncorrelated waveform for each unit interval to form a compensated amplitude voltage array ($[V_s]$).

DETAILED DESCRIPTION

In the drawings, which are not necessarily to scale, like or corresponding elements of the disclosed systems and methods are denoted by the same reference numerals.

Figure 1:
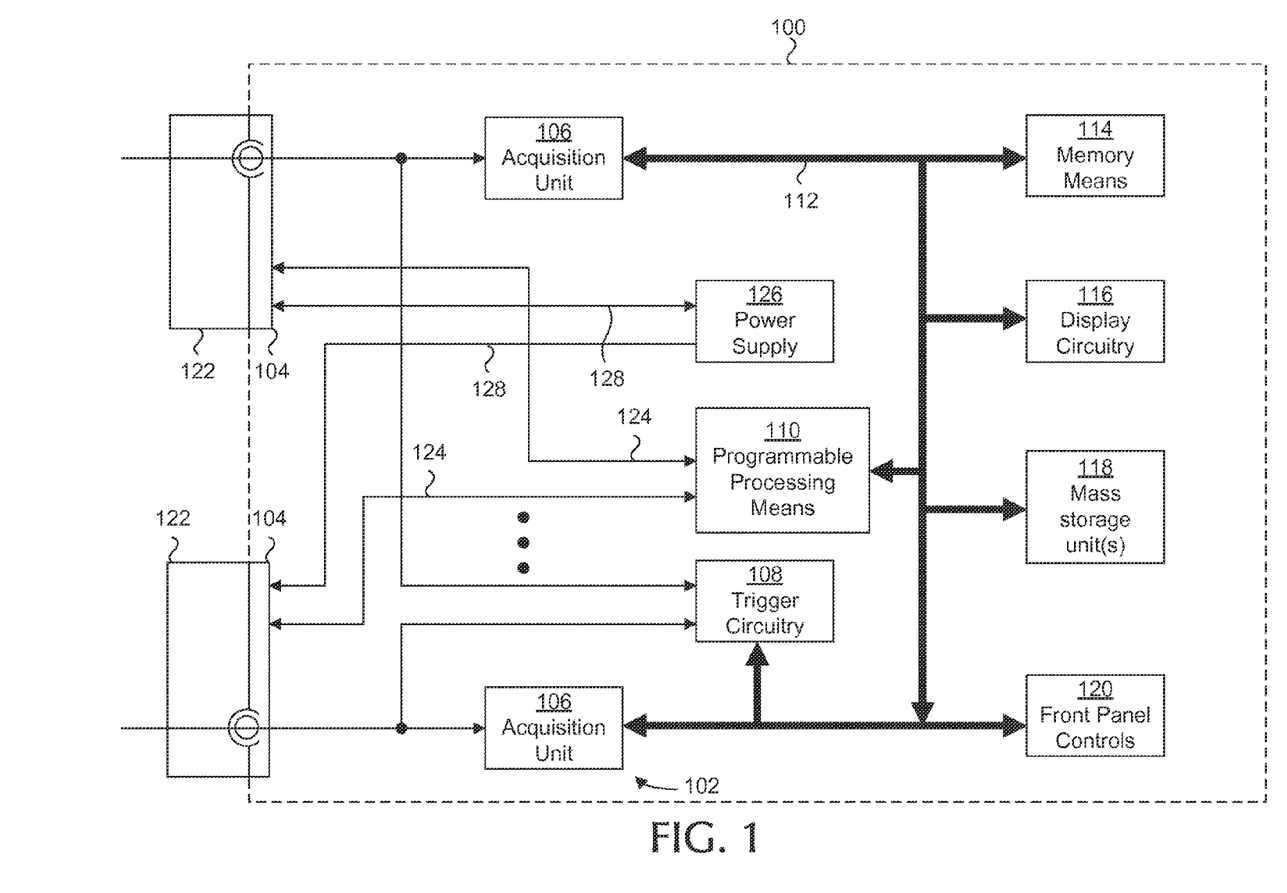
FIG. 1 illustrates a block diagram of a test and measurement instrument for implementing the method for performing joint jitter and noise analysis.

The disclosed technology uses information from a vertical displacement in the center of every bit and a horizontal displacement on every edge to give a very high processing efficiency that is well-matched with the characteristics of a real-time oscilloscope. That is, the method of the disclosed technology uses all unit intervals in a pattern and does not rely only on measurement locations with a zero slew rate. Referring now to FIG. 1, there is shown a representative block diagram of a real-time oscilloscope according to some embodiment of the present invention for implementing the method of performing joint jitter and noise analysis. Although a real-time oscilloscope is shown and discussed below, any type of test and measurement instrument capable of acquiring a suitable representation of a time-domain waveform may be used.

The oscilloscope 100 may have separate signal channels 102 coupled to accessory interfaces 104, two of which are represented in FIG. 1. Each signal channel 102 may have a separate acquisition unit 106 that may include, for example, known electronic circuitry and/or devices for at least receiving an analog waveform input signal from the a device under test or channel and converting the received signal into digitized samples. Each of the analog waveform input signals coupled to the signal channels 102 may also be coupled to trigger circuitry 108. The acquisition unit 106 and the trigger circuitry 108 may be coupled to a programmable processing means 110 via a system bus 112. The system bus 112 may be further coupled to memory means 114 that may, for example, take the form of RAM, ROM and/or cache memory. RAM memory is operable to store volatile data, such as the digitized samples of the analog waveform input signal generated by the acquisition unit 106. The system bus 112 may be further coupled to display circuitry 116 for controlling a display section (not shown), a mass storage unit or units 118, such as a hard disk drive, CD ROM drive, tape drive, floppy drive or the like that reads from and/or writes to appropriate mass storage media, and the front panel controls 120. It should be understood that any number of signal channels 102 may be included in the oscilloscope 100 with each channel having separate acquisitions means 106.

Executable instructions for implementing the methods according to embodiments of the disclosed technology and for otherwise controlling the oscilloscope 100 may be stored and accessed from memory means 114, more particularly, for example from ROM. Alternatively, the executable instructions may be stored and accessed from mass storage media of the mass storage unit 118 which in some embodiments may be included within memory means 114. The processing means 110 may be implemented as, for example, one or more programmable microprocessors, such as those designed and developed by Intel Corporation. The processing means 110 may also be implemented using multiple programmable controllers and/or one or more programmable digital signal processors. In yet another embodiment, when the processing means 110 is implemented using multiple controllers one may be used to control the acquisition and processing of the analog waveform input signal while the second may control the other operations of the oscilloscope 100. The oscilloscope 100 may be controlled using an operating system, such as Windows® 7, designed and developed by Microsoft, Corporation that is stored and accessed within one or more processors or controllers 110 and associated memory means 100.

The display circuitry 116 may include a display controller (not shown) for receiving instructions for controlling the display section from processing means 110 and may receive data as well from a digital signal processor, for example, that is a part of processing means 110 for display by the display section. A bus controller (not shown) may also be included within the processing means 110 or included separately within the oscilloscope 100 for monitoring interfaces 104 and probes 122. The bus controller may also control communications between the probes 122 and the processing means 110 via communications bus 124. The bus 124 may comprise an I$^2$C bus, IEEE 1494 bus, USB bus or the like, that provides bi-directional communications.

A power supply 126 may receive control signals from the processing means 110 for controlling the electrical power to the probes 122 via voltage lines 128 and the accessory interfaces 104.

Figure 2:
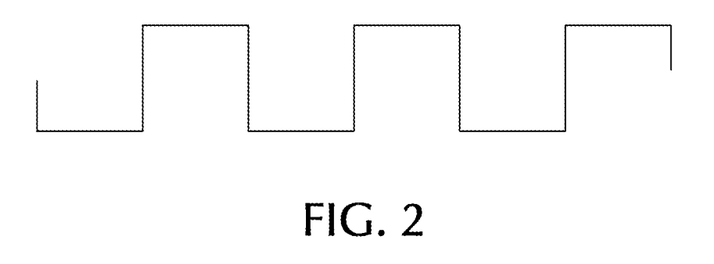
FIG. 2 illustrates an idealized serial data waveform.

FIG. 2 depicts an idealized serial data waveform 200 representing an alternating bit pattern '1 0 1 0 1 0'. However, real waveforms do not have edges with infinite slew rates, and seldom have perfectly flat tops and bottoms. So a more realistic waveform 300 that uses a simplistic piecewise-linear model for each edge and flat spot is shown in FIG. 3.

Figure 3:
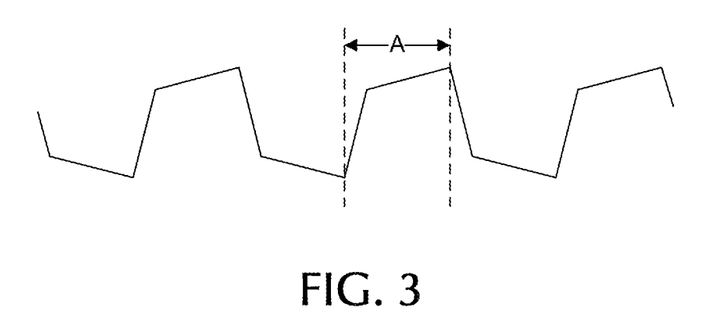
FIG. 3 illustrates a waveform with impairments and defines a unit interval.

Area A in FIG. 3 shows one unit interval (UI) of the waveform. The disclosed technology determines how the actual values in each repeat of this uncorrelated waveform pattern deviate from the correlated waveform, which is the deterministic component of the waveform. The correlated waveform is the actual data pattern in the input signal and the uncorrelated waveform is the horizontal jitter and vertical noise in the input signal and the oscilloscope 100. That is, the uncorrelated waveform is the waveform real-time oscilloscopes naturally acquire. One or more uncorrelated waveform is acquired by the acquisition unit 106 of the oscilloscope 100.

The correlated waveform is then determined via the processing means 110 based on the one or more uncorrelated waveforms acquired by the real-time oscilloscope using any known methods. This may be done, for example, by acquiring multiple uncorrelated waveforms, using a pattern-based trigger, and averaging them together. Further, the correlated waveform may be determined using a single long uncorrelated waveform record, for example by averaging together successive copies of the repeating part of the waveform, after suitable time alignment of the individual copies. The uncorrelated waveform acquired may have a repeating pattern. For example, the uncorrelated waveform may contain a repeating pattern with a length of 9 bits. The correlated waveform may be determined for the repeating pattern, and then repeated end-to-end to create the entire correlated waveform to be compared with the entire uncorrelated waveform record.

Figure 4:
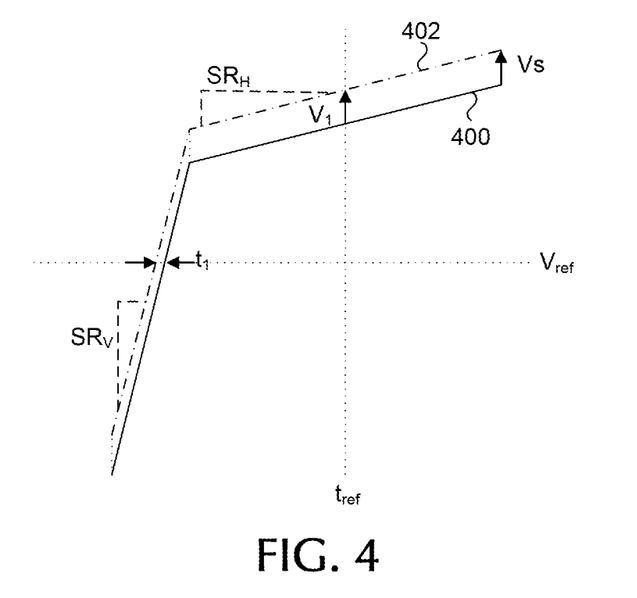
FIGS. 4-6 illustrate superimposed unit intervals of a correlated waveform and an uncorrelated waveform.

FIG. 4 shows one unit interval of a correlated waveform 400 and the uncorrelated waveform 402, using the same piece-wise linear model as discussed above. The horizontal and vertical displacement between the correlated waveform 400 and the uncorrelated waveform 402 is a measure of the uncorrelated jitter and noise. Time displacements to the right may be designated as positive time shifts and voltage shifts upward may be designated as positive voltage shifts, although other conventions may be used as long as they are consistently applied.

In FIG. 4, the waveform 402 is not subject to any timing jitter, and is displaced upward by a constant voltage noise, shown as $V_s$. In reality, noise isn't constant across a UI, but noise of a sufficiently low frequency relative to the bit rate can be regarded as constant as a reasonable approximation. $SR_V$ designates the slew rate of the waveform 402 on the nominally vertical portion. $SR_H$ designates the slew rate on the nominally horizontal portion.

Even though there is no timing jitter in FIG. 4, there is an apparent jitter since the point at which the rising edge crosses a reference voltage ($V_{ref}$) has changed. The apparent timing displacement can be seen to be $-t_1$. The apparent voltage displacement is determined at a nominal timing point, shown as $t_{ref}$, normally at the center of the bit. The apparent voltage displacement is shown as $V_1$ in FIG. 4. The following equations can be written based on the observations of FIG. 4:

$$V_1 = V_s \quad (1)$$

$$t_1 = -V_s/SR_V \quad (2)$$

The negative sign in equation (2) is due to the upward voltage shift causing an apparent timing shift to the left.

Figure 5:
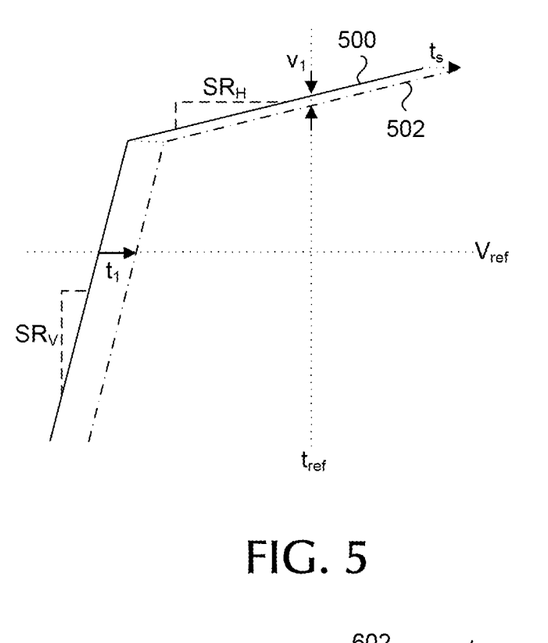

FIG. 5 shows a unit interval of a correlated waveform 500 and an uncorrelated waveform 502. In FIG. 5, the displacement is caused by a purely horizontal shift, $t_s$, and the corresponding equations can be written, as follows.

$$V_1 = -SR_H * t_s \quad (3)$$

$$t_1 = t_s \quad (4)$$

The negative sign in equation (3) shows that a rightward timing shift results in an apparent voltage shift downward, if $SR_H$ is positive.

Figure 6:
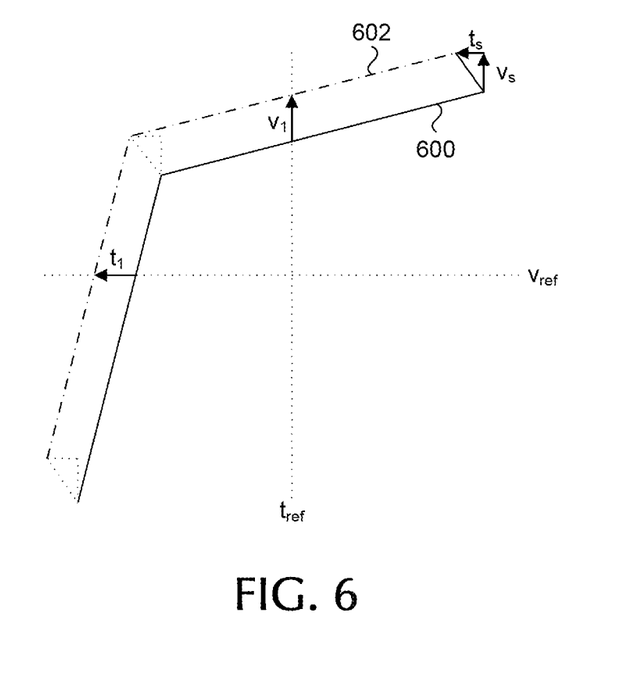

FIG. 6 shows a unit interval of a correlated waveform 600 and an uncorrelated waveform 602. In FIG. 6, the uncorrelated waveform 602 has been displaced both vertically and horizontally for this unit interval. By superposition, equations (1) and (3) can be combined to obtain equation (5), below, and equations (2) and (4) can be combined to obtain equation (6), below. This leaves two unknowns in each of the equations, $t_s$ and $V_s$.

$$V_1 = V_s - SR_H * t_s \quad (5)$$

$$t_1 = t_s - (1/SR_V) * V_s \quad (6)$$

Equations (5) and (6) express the apparent, or directly measurable, waveform displacement in terms of the true vertical and horizontal shift. Equations (5) and (6) may be algebraically manipulated to lead to the following equations, which allow the true shifts to be calculated from the measured displacements:

$$t_s = (V_1 + SR_V * t_1)/(SR_V - SR_H) \quad (7)$$

$$V_s = V_1 + SR_H * t_s \quad (8)$$

Equations (7) and (8) can be applied for each unit interval in the waveform record so that the directly measureable $t_1$ and $V_1$ are jointly converted to $t_s$ and $V_s$ for that interval. For a waveform consisting of N unit intervals, or bits, this results in two numerical arrays: The compensated edge time array $t_s = [t_{s1}, t_{s2}, t_{s3}, \ldots t_{sN}]$ and the compensated amplitude array $V_s = [V_{s1}, V_{s2}, V_{s3}, \ldots V_{sN}]$. These arrays can be processed in various ways in order to derive further information about jitter and voltage noise behavior, and to allow a statistical eye diagram to be formed, as discussed in more detail below.

To apply equations (7) and (8) to real signals rather than to the piece-wise linear model that was assumed for their development, the parameters $t_1$, $V_1$, $SR_V$ and $SR_H$ must be determined for each unit interval. It is straightforward to determine $t_1$ by computing the points at the two ends of the $t_1$ vector and performing a subtraction. The subtracted endpoint may be determined by any of the well-known interpolation methods, such as linear or sin (x)/x, using nearby actual waveform samples from the correlated or uncorrelated waveforms. The simplest way to determine $SR_V$ is to locate the sample of the correlated waveform that most closely precedes the point where the correlated waveform crosses $V_{ref}$ and compute the slew rate between this sample and the subsequent sample as the voltage difference divided by the time difference. Similarly, $SR_H$ can be computed from the two samples of the correlated waveform that precede and follow $t_{ref}$. Other slew rate estimation means can easily be devised (for example by using more than just the two closest samples) to provide $SR_V$ and $SR_H$ values representative of a wider section of the waveform.

The above equations (1)-(8) perform quite well for small-signal analysis of an alternating-bit pattern. However, these equations can be modified to make the usefulness of the equations more general.

Figure 7:
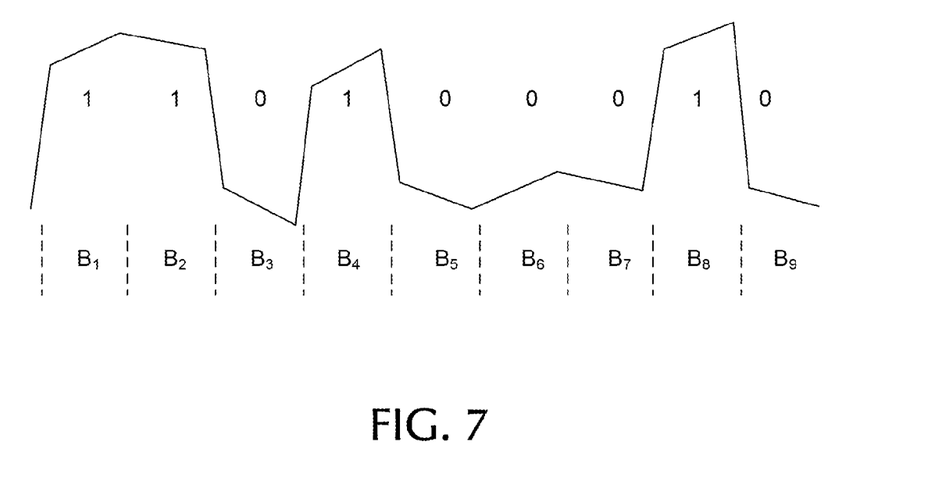
FIGS. 7 and 8 illustrate waveforms with more complex patterns and impairments.

In many cases, as seen in FIG. 7, a waveform to be analyzed may carry a more complex pattern than alternating 1's and 0's. FIG. 7 shows a one repeat of a nine-bit pattern. In FIG. 7, the logical values (1 or 0) corresponding to each interval are shown in the centers of the intervals, and the bit numbers that unique identify each bit in the pattern are shown as subscripted 'B's. The nine-bit pattern is understood to repeat indefinitely, and the waveform in FIG. 7 represents a correlated waveform for a single repeat of the waveform.

Compare to the waveform shown in FIG. 3, it can be seen that some bits in FIG. 7, such as $B_1$, can be modeled in an analogous way, using a linearizes $SR_V$ for the voltage transition and an $SR_H$ for the center of the bit interval. Similar values can be determined for bits $B_3$, $B_4$, $B_5$, $B_8$, and $B_9$. These bits are called transition bits. But for non-transition bits, that is, those that follow another bit of the same logical value, such as $B_2$, $B_6$, and $B_7$, there is no vertical transition at the beginning of the bit and therefore no corresponding $SR_V$.

The voltage deviation from the correlated waveform ($V_1$) can be measured for each unit interval, but the timing deviation ($t_1$) can only be measured when there is an edge. Therefore, equations (7) and (8) discussed above cannot be directly applied to determine the compensated edge time array or the compensated amplitude array.

To solve this, $t_s$ may be computed using equation (7) for only the transition bits. The missing $t_s$ values in the repeating pattern may be filled in using one of several possible interpolation methods. The simplest method is to fill in the missing $t_s$ values in the compensated edge time array with zeroes. Another simple approach is to fill in the missing $t_s$ values using linear or spline interpolation, using nearby preceding and subsequent $t_s$ values from actual transitions. Then, equation (8) can be applied to get the array of compensated voltage values, $V_s$.

There are many serial data waveforms that may not be well-represented by the simple linearized model shown in FIG. 7, with a constant slew rate for each high or low bit. However, the above disclosed methods may be extended to allow for multiple slew rates per bit, as shows in FIG. 8.

Figure 8:
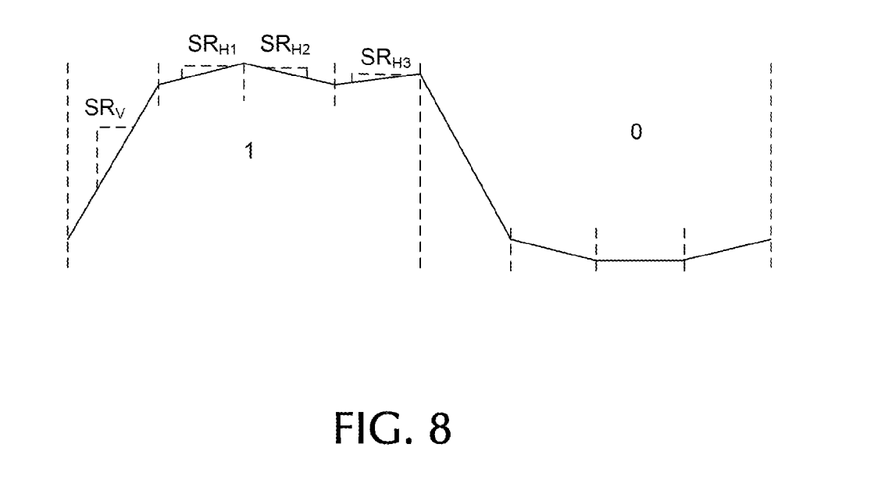

FIG. 8 shows two unit intervals representing the logical bit sequence [1 0]. Unlike FIG. 4, where each bit is modeled by a single edge slew rate and a single horizontal slew rate, each bit in FIG. 7 is modeled by an edge slew rate plus three horizontal slew rates. For example, this may be done by dividing each unit interval into four zones of equal width, with the first zone centered on the nominal edge time and the third zone centered at $t_{ref}$. For the first zone, the parameters $t_1$ and $SR_V$ are determined as discussed above. For each of the three horizontal zones, a corresponding $V_1$ and $SR_H$ parameter may be determined using actual samples nearest to the center of that zone, as described above for the simplest waveform model.

It is apparent from this that the approach discussed above can be adapted to the more complex model of FIG. 8. The most straightforward approach is to speculatively apply equation (7) three times, each time using the measured values of $t_1$ and $V_1$ with one of the mean slew rates $SR_{H1}$-$SR_{H3}$. Each of the resultant $t_s$ values (which may be called $t_{s1}$, $t_{s2}$ and $t_{s3}$)

represent an estimate of the true horizontal waveform displacement under the hypothesis that the true horizontal displacement caused the corresponding slew rate segment (represented by $SR_{H1}$, $SR_{H2}$ and $SR_{H3}$) to instantaneously shift to the actual voltage measurement point $t_{ref}$. Estimate $t_{s2}$ is typically the most likely since $t_{ref}$ falls in the center of the second horizontal zone so it corresponds to zero jitter. If estimate $t_{s2}$ is smaller than half the width of this zone, the hypothesis that $SR_{H2}$ was the correct slew rate to use is attractive. Estimate $t_{s1}$ should be the proper estimate to use only if the instantaneous jitter that $t_{s1}$ represents is approximately ¼ of a UI to the right (late in time, or a positive value according to the proposed convention), so that slew rate $SR_{H1}$ would fall at the point where $V_1$ was measured. If $t_{s1}$ is calculated to be near ¼ of a UI, this hypothesis becomes attractive. Finally, the hypothesis that to is correct is attractive if it is near −¼ of a UI, since that amount of waveform shift would cause $SR_{H3}$ to fall at the voltage measurement point. So the extent to which each hypothesis is consistent with its resultant jitter estimate can be used as a selection criteria.

A basic assumption that led to the development of equations (7) and (8) discussed above was that the time and voltage displacement at the middle of each data edge and the time and voltage displacement at the subsequent center-of-the-UI were the same. This is a reasonable assumption for timing jitter and voltage noise occurring at low frequencies. As the frequency of the jitter and noise approach a significant percentage of the data rate, the degree of correlation between two points separated by ½ of a unit interval drops.

To account for this, additional processing can be done prior to the application of equations (7) and (8). After $t_1$ and $V_1$ are measured, low-pass filters can be applied to both, before they are used to calculate $t_s$ and $V_s$ in the area where the assumptions are not met. Recall that $t_1$ and $V_1$ are calculated for every UI, as discussed above, so each of $t_1$ and $V_1$ is actually an array of values rather than a single value. For example, $t_1$ is actually $[t_{11}, t_{12}, t_{13}, \ldots t_{1N}]$ if there are N unit intervals in the waveform, and it can be represented as $[t_1]$ as a reminder that it is an array of values equally-spaced in time. It is straightforward to use digital filtering to apply a low-pass filter to this array, for example using either convolution or FFT-based methods. The arrays $[t_1]$ and $[V_1]$ may each be low-pass filtered to yield new arrays $[t_{1LP}]$ and $[V_{1LP}]$. The individual values from the new filtered arrays can be substituted for the corresponding values from the unfiltered arrays when equations (7) and (8) are applied.

Up to this point, one apparent-jitter array $([t_1])$ and one apparent-noise array $([V_1])$ have been directly measured, and one true-jitter array $([t_s])$ and one true-noise array $([V_s])$ have been calculated using equations (7) and (8), or variations thereof, with the goal of more accurately decoupling the effects of jitter from noise.

Using these arrays, a two-dimensional probability density function (PDF) of uncorrelated noise may be generated and used as described in U.S. Pat. No. 7,522,661, discussed above, by using the following steps.

First, a spectrum of timing jitter is generated by performing a Fourier transform on the array $[t_s]$. The magnitude of this spectrum is a modified periodogram power spectrum of the timing jitter. This is separated into deterministic frequency components and random frequency components by identifying frequency components that have a significantly higher magnitude than the local surrounding frequency spectrum. The random components are filtered out of the magnitude spectrum to form a power spectrum of the uncorrelated deterministic jitter.

Second, based on the deterministic frequencies determined in the first step above, the complex spectrum generated from $[t_s]$ is filtered to remove the random frequency components, and the remaining deterministic frequency components are inverse-Fourier-transformed to create a time-domain record of the uncorrelated deterministic jitter. The peak-to-peak, root-mean-square (rms), or other useful values of the uncorrelated deterministic jitter can be determined directly from this record.

Third, the time-domain record of the uncorrelated deterministic jitter from step two is converted to the form of a histogram, which can be interpreted as the probability density function (PDF) of the uncorrelated deterministic jitter.

Fourth, steps one through three are repeated using the voltage noise array $[V_s]$ to produce a PDF of the uncorrelated deterministic noise as well as peak-to-peak and rms values.

Fifth, a complex spectrum of timing jitter is generated by performing a Fourier transform on the array $[t_1]$. Using the deterministic jitter frequencies determined in step one, this spectrum is filtered to mask out those frequencies and leave only the random timing jitter. This spectrum is inverse-Fourier-transformed to provide a time record of the uncorrelated random jitter.

Sixth, the time record of the uncorrelated random jitter from step five is converted to the form of a histogram of jitter amplitude versus frequency-of-occurrence. This histogram (which can be accumulated across multiple individual captured waveforms) is plotted on a Q-scale, and linear asymptotic fits to the left and right sides of the Q-scale plot are used to estimate the rms amplitude of Gaussian random jitter and the dual-dirac amplitude of non-Gaussian random jitter.

Seventh, the rms amplitude of Gaussian random jitter from step six is used to form a Gaussian PDF that can be extended to the left and right along the horizontal axis (into the Gaussian tails) to levels of population lower than present in the measured data.

Eighth, the dual-dirac amplitude of non-Gaussian random jitter is used to form a dual-dirac PDF consisting of two spikes each with negligible width but probability density of ½, separated by the calculated amplitude value.

Ninth, steps five through eight are repeated using the voltage noise array $[V_1]$ to produce an estimate of the Gaussian random voltage noise and the dual-dirac amplitude of non-Gaussian random voltage noise, and PDFs of each of these.

Tenth, the PDF of the uncorrelated deterministic jitter from step three is convolved with the PDF of Gaussian jitter from step seven and the PDF of non-Gaussian random jitter from step eight to produce a PDF of all the uncorrelated jitter.

Eleventh, similarly, the PDFs of uncorrelated deterministic noise, Gaussian noise and non-Gaussian noise are convolved to produce a PDF of all uncorrelated noise.

Twelfth, the one-dimensional PDFs from steps ten and eleven are used to produce a two-dimensional PDF of uncorrelated jitter and noise. The uses of this two-dimensional PDF to produce a BER eye contour are as described in U.S. Pat. No. 7,522,661.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A method for determining jitter and noise of an input signal, comprising:

acquiring at least one uncorrelated waveform record by an acquisition unit of the test and measurement instrument;

determining a correlated waveform based on the at least one uncorrelated waveform;
dividing the correlated waveform into unit intervals;
dividing the at least one uncorrelated waveform into unit intervals;
measuring a timing displacement ($t_1$) between the correlated waveform and the uncorrelated waveform for each unit interval to form an apparent-jitter array ($[t_1]$);
measuring a voltage displacement ($V_1$) between the correlated waveform and the uncorrelated waveform for each unit interval to form an apparent-noise array ($[V_1]$);
calculating a horizontal shift ($t_s$) between the correlated waveform and the uncorrelated waveform for each unit interval to form a compensated edge time array ($[t_s]$); and
calculating a vertical shift ($V_s$) between the correlated waveform and the uncorrelated waveform for each unit interval to form a compensated amplitude voltage array ($[V_s]$),
wherein the horizontal shift and the vertical shift are calculated for each unit interval using the following equations:

$$t_s = (V_1 + SR_V * t_1)/(SR_V - SR_H), \text{ and}$$

$$V_s = V_1 + SR_H * t_s,$$

wherein $SR_V$ represents a slew rate of the uncorrelated waveform on a vertical portion of the uncorrelated waveform and $SR_H$ represents the slew rate of the uncorrelated waveform on a horizontal position of the uncorrelated waveform.

2. The method of claim 1, wherein the horizontal shift is calculated for each transition bit unit interval and set to 0 for each non-transition bit unit interval.

3. The method of claim 1, wherein the horizontal shift is calculated for each transition bit unit interval using the equation for $t_s$ and the horizontal shift is calculated for each non-transition bit unit interval using nearby preceding and subsequent unit interval horizontal shifts by interpolation.

4. The method of claim 1, further comprising filtering, using a low-pass filter, the timing displacement and the voltage displacement prior to calculating the horizontal shift and the vertical shift.

5. The method of claim 1, wherein the equation for $t_s$ is calculated a plurality of times, using a plurality of slew rates, and the method further includes selecting one of the plurality of calculated $t_s$ values for each unit interval based on a resultant jitter estimate.

6. The method of claim 1, further comprising generating a two-dimensional probability density function of uncorrelated noise using the apparent-jitter array, the apparent noise array, the compensated edge time array, and the compensated amplitude voltage array.

7. The method of claim 6, further comprising generating a bit error rate diagram based on the generated two-dimensional probability density function.

8. The method of claim 1, further comprising generating a bit error rate diagram based on the apparent-jitter array, the apparent-noise array, the compensated edge time array, and the compensated amplitude voltage array.

9. The method of claim 1, wherein the test and measurement instrument is a real-time oscilloscope.

10. A test and measurement instrument, comprising
acquisition means configured to receive at least one uncorrelated waveform record; and
processing means for:
determining a correlated waveform based on the at least one uncorrelated waveform;
dividing the correlated waveform into unit intervals;
dividing the uncorrelated waveform into unit intervals;
measuring a timing displacement ($t_1$) between the correlated waveform and the uncorrelated waveform for each unit interval to form an apparent-jitter array ($[t_1]$);
measuring a voltage displacement ($V_1$) between the correlated waveform and the uncorrelated waveform for each unit interval to form an apparent-noise array ($[V_1]$);
calculating a horizontal shift ($t_s$) between the correlated waveform and the uncorrelated waveform for each unit interval to form a compensated edge time array ($[t_s]$); and
calculating a vertical shift ($V_s$) between the correlated waveform and the uncorrelated waveform for each unit interval to form a compensated amplitude voltage array ($[V_s]$),
wherein the horizontal shift and the vertical shift are calculated for each unit interval using the following equations:

$$t_s = (V_1 + SR_V * t_1)/(SR_V - SR_H), \text{ and}$$

$$V_s = V_1 + SR_H * t_s,$$

wherein $SR_V$ represents a slew rate of the uncorrelated waveform on a vertical portion of the uncorrelated waveform and $SR_H$ represents the slew rate of the uncorrelated waveform on a horizontal position of the uncorrelated waveform.

11. The method of claim 10, wherein the processing means is further configured to generate a two-dimensional probability density function of uncorrelated noise using the apparent-jitter array, the apparent noise array, the compensated edge time array, and the compensated amplitude voltage array.

12. The method of claim 11, wherein the processing means is further configured to generate a bit error rate diagram based on the generated two-dimensional probability density function.

13. The method of claim 10, wherein the processing means is configured to generate a bit error rate diagram based on the apparent-jitter array, the apparent-noise array, the compensated edge time array, and the compensated amplitude voltage array.

* * * * *

UNITED STATES PATENT AND TRADEMARK OFFICE
CERTIFICATE OF CORRECTION

PATENT NO. : 9,294,237 B2
APPLICATION NO. : 14/552265
DATED : March 22, 2016
INVENTOR(S) : Mark L. Guenther et al.

It is certified that error appears in the above-identified patent and that said Letters Patent is hereby corrected as shown below:

IN THE SPECIFICATION

In column 7, line 16, replace "to" with -- $t_{s3}$ --.

Signed and Sealed this
Thirty-first Day of May, 2016

Michelle K. Lee
*Director of the United States Patent and Trademark Office*